(12) United States Patent
Tetelbaum et al.

(10) Patent No.: US 6,480,994 B1
(45) Date of Patent: Nov. 12, 2002

(54) BALANCED CLOCK PLACEMENT FOR INTEGRATED CIRCUITS CONTAINING MEGACELLS

(75) Inventors: Alexander Tetelbaum, Hayward, CA (US); Rajiv Kapur, Menlo Park, CA (US)

(73) Assignee: LSI Logic Corporation, Milpitas, CA (US)

( * ) Notice: Subject to any disclaimer, the term of this patent is extended or adjusted under 35 U.S.C. 154(b) by 93 days.

(21) Appl. No.: 09/788,257

(22) Filed: Feb. 15, 2001

(51) Int. Cl.[7] .............................................. G06F 17/50
(52) U.S. Cl. ......................................................... 716/10
(58) Field of Search .......................................... 716/10

(56) References Cited

U.S. PATENT DOCUMENTS

| | | | | |
|---|---|---|---|---|
| 5,481,209 A | * | 1/1996 | Lim et al. .................... | 326/93 |
| 5,564,022 A | * | 10/1996 | Debnath et al. ............ | 395/250 |
| 5,774,371 A | * | 6/1998 | Kawakami .................. | 716/10 |
| 6,111,448 A | * | 8/2000 | Shibayama ................. | 327/293 |
| 6,127,874 A | * | 10/2000 | Wakabayashi et al. ...... | 327/292 |
| 6,266,803 B1 | * | 7/2001 | Scherer et al. ............. | 716/12 |

OTHER PUBLICATIONS

G.M. Blair, Skew–free Clock Distribution for Standard–cell VLSI Designs, IEEE Proceedings on Circuits, Devices, and Systems, pp. 265–267, Apr. 1992.*

P. Ramanathan et al., A Clock Distribution Scheme for Non–symmetric VLSI Circuits, IEEE International Conference on Computer–Aided Design, pp. 398–401, Nov. 1999.*

* cited by examiner

Primary Examiner—Vuthe Siek
Assistant Examiner—A. M. Thompson
(74) Attorney, Agent, or Firm—Fitch, Even, Tabin & Flannery

(57) ABSTRACT

A method of clock buffer placement for minimizing clock skew for an integrated circuit includes the steps of (a) finding an ideal location for a clock buffer on an integrated circuit that minimizes clock skew, (b) checking whether the ideal clock buffer location overlaps a megacell, and (c) finding a location for the clock buffer that is closest to the ideal clock buffer location and that does not overlap a megacell.

6 Claims, 3 Drawing Sheets

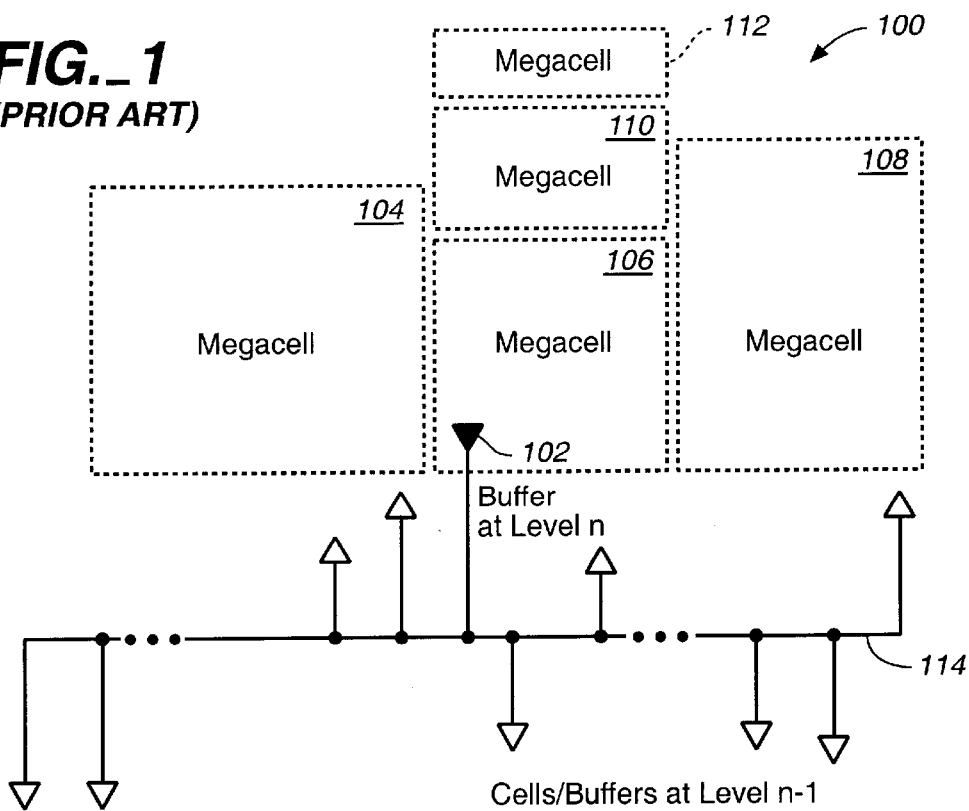
FIG._1
(PRIOR ART)
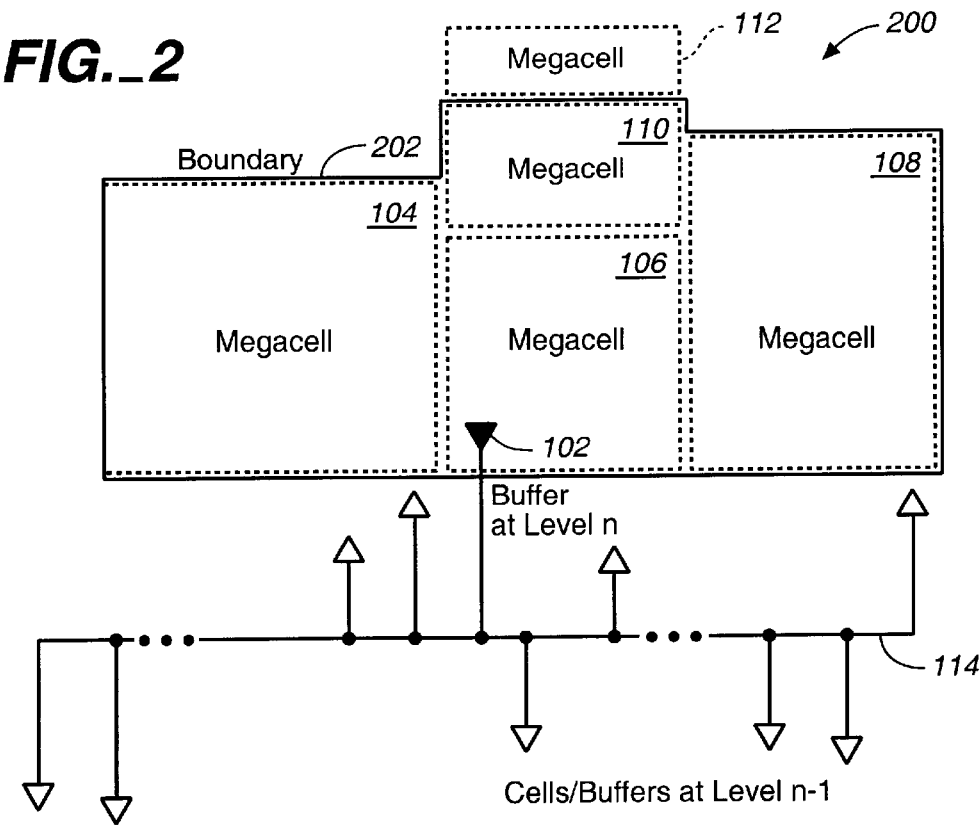
FIG._2

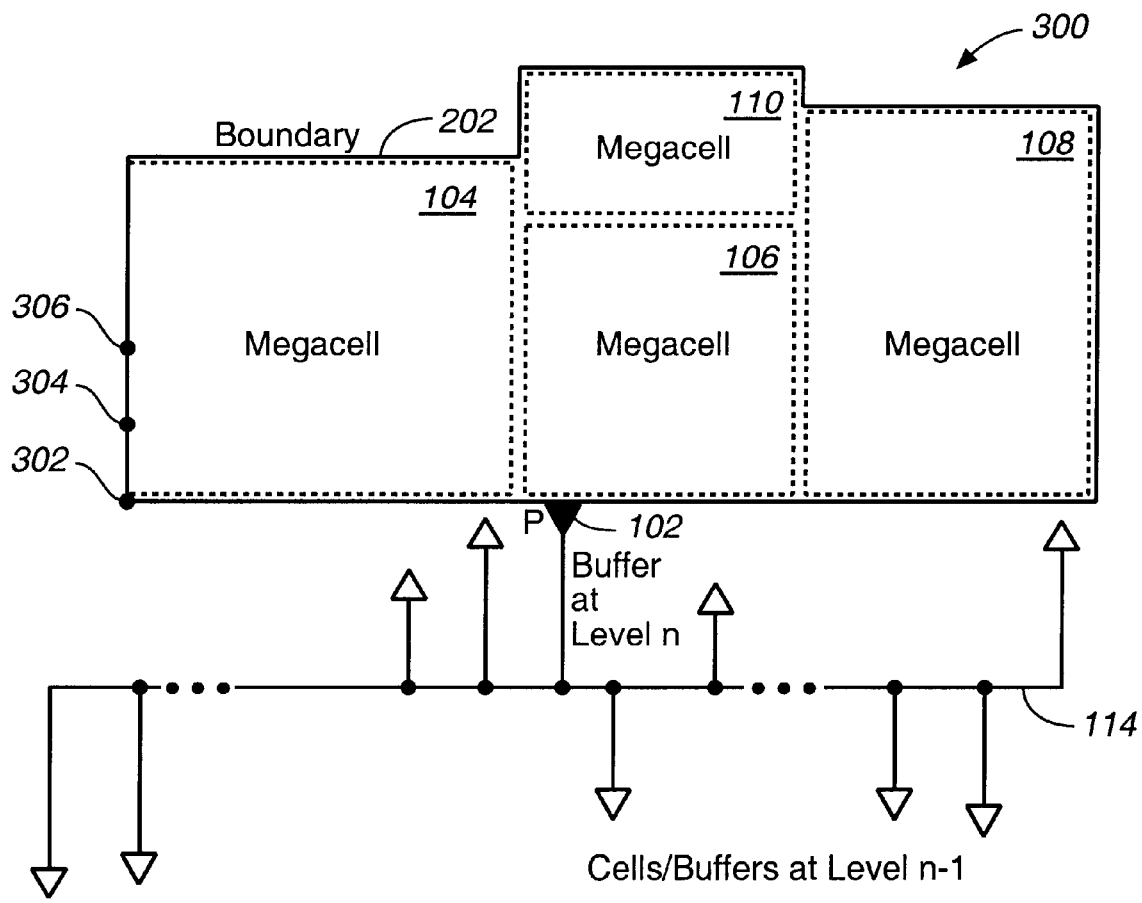
FIG._3

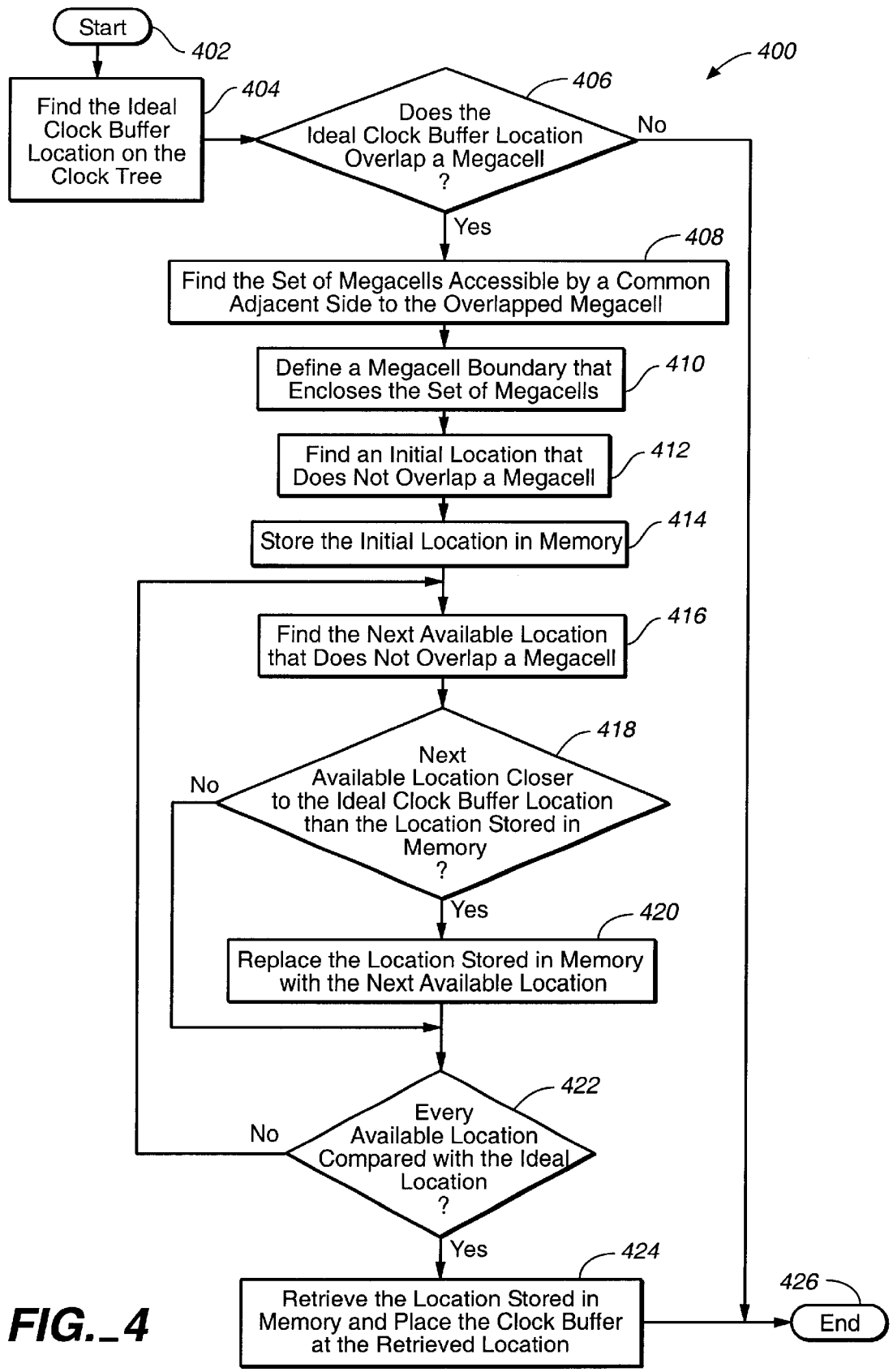
FIG._4

BALANCED CLOCK PLACEMENT FOR INTEGRATED CIRCUITS CONTAINING MEGACELLS

BACKGROUND OF THE INVENTION

The present invention relates generally to design tools for integrated circuits. More specifically, but without limitation thereto, the present invention relates to a method for placing clock buffers within an integrated circuit containing megacells to minimize clock skew.

Integrated circuits typically include blocks or partitions of multiple circuit elements such as flip-flops, cores, building block circuits called hard macros, "hardmacs", or megacells. Some circuit elements are generally synchronized by a common clock signal from a clock buffer located within the integrated circuit chip. Using current methods for balanced clock placement, the ideal clock buffer placement may overlap with a megacell. In that case, the clock buffer is simply moved in either the vertical direction or the horizontal direction until an available space is found. This approach may lead to placement of the clock buffer at a large distance from the ideal location, resulting in a large clock skew.

SUMMARY OF THE INVENTION

The present invention advantageously addresses the problems above as well as other problems by providing a balanced clock placement method for each clock buffer in an integrated circuit having megacells that minimizes clock skew.

In one embodiment, the present invention may be characterized as a method of clock buffer placement for minimizing clock skew in an integrated circuit having megacells that includes the steps of (a) finding an ideal location for a clock buffer on an integrated circuit that minimizes clock skew, (b) checking whether the ideal clock buffer location overlaps a megacell, and (c) finding a location for the clock buffer that is closest to the ideal clock buffer location and that does not overlap a megacell.

In another embodiment, the present invention may be characterized as a computer program product that includes a medium for embodying a computer program for input to a computer and a computer program embodied in the medium for causing the computer to perform at least one of the following functions:

(a) finding an ideal clock buffer location on a clock tree that minimizes clock skew;

(b) checking whether the ideal clock buffer location overlaps a megacell;

(c) finding a set of megacells that are accessible by a common adjacent side to an overlapped megacell;

(d) defining a megacell boundary that encloses the set of megacells;

(e) finding an initial location where the clock buffer may be placed without overlapping a megacell;

(f) storing the initial location in memory;

(g) finding the next available location where the clock buffer may be placed without overlapping a megacell;

(h) checking whether the next available location is closer to the ideal clock buffer location than the location stored in memory;

(i) replacing the location stored in memory with the next available location found in step (g);

(j) checking whether every available location has been compared with the ideal clock buffer location;

(k) retrieving the location stored in memory; and (l) placing the clock buffer at the retrieved location.

BRIEF DESCRIPTION OF THE DRAWINGS

The above and other aspects, features and advantages of the present invention will be more apparent from the following more specific description thereof, presented in conjunction with the following drawings wherein:

FIG. 1 is a diagram of a group of megacells including a balanced clock tree of the prior art;

FIG. 2 is a diagram illustrating a method 200 for finding a megacell boundary 202 for the group of FIG. 1 to minimize clock skew according to an embodiment of the present invention;

FIG. 3 is a diagram of a method for an optimum clock buffer placement in the presence of the megacells in FIG. 1 to minimize clock skew according to the method of FIG. 2; and FIG. 4 is a flowchart for the method of clock buffer placement of FIG. 2 and FIG. 3.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

FIG. 1 is a diagram of a group of megacells 100 including a balanced clock tree of the prior art. Shown in FIG. 1 are a clock buffer 102, megacells 104, 106, 108, 110, and 112, and a balanced clock tree 114. The balanced clock tree 114 distributes the clock signal from the clock buffer 102 to each circuit element in the area next to the group of megacells.

The clock buffer 102 provides clock pulses to the balanced clock tree 114. Because the wire lengths from the clock buffer 102 through the clock tree 114 usually differ, the clock pulses arrive at each circuit element in the clock tree at different times. The differences in propagation delays from the clock buffer 102 to each circuit element is called clock skew. A clock skew in excess of a maximum skew tolerance could cause the integrated circuit to malfunction. By selecting the optimum location for placing the clock buffer on the balanced clock tree 114, clock skew may be minimized. If the ideal location for the clock buffer 102 overlaps one of the megacells 104, 106, 108, 110, and 112, however, the clock buffer 102 must be moved to another location. Previous methods move the clock buffer 102 in one direction or another until an available location is found. These methods may result in a location for clock buffer 102 that results in an unacceptable clock skew.

FIG. 2 is a diagram illustrating a method 200 for finding a megacell boundary 202 for the megacell group 100 in FIG. 1 to minimize clock skew. If the ideal clock buffer location, i.e., the clock buffer location that minimizes clock skew, overlaps one of the megacells 104, 106, 108, 110, and 112, then a search is performed to find a set {M} of all megacells in the megacell group 100 that may be reached from the overlapped megacell from a common adjacent side. In this example, the set {M} includes the megacells 104, 106, 108, and 110. The megacell boundary 202 is then defined as the polygon that encloses the set {M}.

FIG. 3 is a diagram illustrating a method 300 for an optimum clock buffer placement for the megacell group in FIG. 1 to minimize clock skew according to the method of FIG. 2. In contrast to previous methods that simply move the clock buffer 102 in either the vertical or the horizontal direction to find the next available space, the method described above places the new clock buffer position P closest to the ideal clock buffer position without overlapping a megacell.

Initially, a first available location 302 on the megacell boundary 202 where the clock buffer 102 may be placed is found and stored in memory. The next available location 304 is found on the megacell boundary 202 where the clock buffer 102 may be placed. If the next location 304 is closer to the ideal location of the clock buffer 102 than the previously stored location 302, then the new location 304 replaces the previous location 302 stored in memory. The next available location 306 along the megacell boundary 202 is then compared to the ideal location of the clock buffer 102, and so on until all the available locations have been compared to the ideal location of the clock buffer 102. The clock buffer 102 is placed in the last location stored in memory that is closest to the ideal location. In this example, the location closest to the ideal location that does not overlap a megacell is location P.

FIG. 4 is a flowchart 400 of the method for finding the megacell boundary 202 of FIG. 2 and for the clock buffer placement of FIG. 3. Step 402 is the entry point for the flowchart 400. Step 404 finds an ideal clock buffer location on a clock tree that minimizes clock skew. Step 406 checks whether the ideal clock buffer location overlaps a megacell. If no, then the ideal clock buffer location is selected and control transfers to step 426. If yes, then step 408 finds a set of megacells that are accessible by a common adjacent side to the overlapped megacell. Step 410 defines a megacell boundary that encloses the set of megacells. Step 412 finds an initial location where the clock buffer 102 may be placed without overlapping a megacell. Step 414 stores the initial location in memory. Step 416 finds the next available location where the clock buffer may be placed without overlapping a megacell. Step 418 checks whether the next available location is closer to the ideal clock buffer location than the location stored in memory. If yes, then step 420 replaces the location stored in memory with the next available location found in step 416. Step 422 checks whether every available location has been compared with the ideal clock buffer location in step 416. If yes, then step 424 retrieves the location stored in memory, which is the location closest to the ideal clock buffer location, and places the clock buffer at the retrieved location. If no, then step 422 transfers control to step 416 until every available location has been compared with the ideal clock buffer location. Step 426 is the exit point for the flowchart 400.

The method described above may readily be implemented in a computer program for finding the optimum clock buffer location that minimizes clock skew within each clock tree of an integrated circuit containing megacells.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of clock buffer placement for minimizing clock skew in an integrated circuit having megacells that includes the steps of:
   (a) finding an ideal location for a clock buffer on an integrated circuit that minimizes clock skew;
   (b) checking whether the ideal clock buffer location overlaps a megacell; and
   (c) finding a location for the clock buffer that is closest to the ideal clock buffer location and that does not overlap a megacell.

2. The method of claim 1 wherein step (c) includes finding a set of megacells accessible by a common adjacent side to the megacell overlapped if the ideal clock buffer location overlaps a megacell.

3. The method of claim 2 wherein step (c) includes defining a megacell boundary that encloses the set of megacells.

4. The method of claim 3 wherein step (c) includes comparing each available location along the megacell boundary to find the location for the clock buffer that is closest to the ideal clock buffer location.

5. A method of clock buffer placement for minimizing clock skew in an integrated circuit having megacells comprising the steps of:
   (a) finding an ideal clock buffer location on a clock tree that minimizes clock skew;
   (b) checking whether the ideal clock buffer location overlaps a megacell;
   (c) finding a set of megacells that are accessible by a common adjacent side to an overlapped megacell;
   (d) defining a megacell boundary that encloses the set of megacells;
   (e) finding an initial location where the clock buffer may be placed without overlapping a megacell;
   (f) storing the initial location in memory;
   (g) finding the next available location where the clock buffer may be placed without overlapping a megacell;
   (h) checking whether the next available location is closer to the ideal clock buffer location than the location stored in memory;
   (i) replacing the location stored in memory with the next available location found in step (g);
   (j) checking whether every available location has been compared with the ideal clock buffer location;
   (k) retrieving the location stored in memory; and
   (l) placing the clock buffer at the retrieved location.

6. A computer program product comprising:
   a medium for embodying a computer program for input to a computer; and
   a computer program embodied in the medium for causing the computer to perform at least one of the following functions:
   (a) finding an ideal clock buffer location on a clock tree that minimizes clock skew;
   (b) checking whether the ideal clock buffer location overlaps a megacell;
   (c) finding a set of megacells that are accessible by a common adjacent side to an overlapped megacell;
   (d) defining a megacell boundary that encloses the set of megacells;
   (e) finding an initial location where the clock buffer may be placed without overlapping a megacell;
   (f) storing the initial location in memory;
   (g) finding the next available location where the clock buffer may be placed without overlapping a megacell;
   (h) checking whether the next available location is closer to the ideal clock buffer location than the location stored in memory;
   (i) replacing the location stored in memory with the next available location found in step (g);
   (j) checking whether every available location has been compared with the ideal clock buffer location;
   (k) retrieving the location stored in memory; and
   (l) placing the clock buffer at the retrieved location.

* * * * *